US00RE36159E

United States Patent [19]

Nakano

[11] E Patent Number: Re. 36,159

[45] Reissued Date of Patent: Mar. 23, 1999

[54] SEMICONDUCTOR INTEGRATED CIRCUIT DEVICE HAVING BUILT-IN VOLTAGE DROP CIRCUIT

[75] Inventor: Masao Nakano, Kawasaki, Japan

[73] Assignee: Fujitsu Limited, Kanagawa, Japan

[21] Appl. No.: 771,253

[22] Filed: Dec. 20, 1996

Related U.S. Patent Documents

Reissue of:

[64] Patent No.: 5,376,837
Issued: Dec. 27, 1994
Appl. No.: 973,375
Filed: Nov. 10, 1992

[30] Foreign Application Priority Data

Nov. 12, 1991 [JP] Japan ..... 3-295625

[51] Int. Cl.[6] ..... H03K 3/38

[52] U.S. Cl. ..... 327/530; 327/51

[58] Field of Search ..... 327/51, 530

[56] References Cited

U.S. PATENT DOCUMENTS 5,023,476 6/1991 Watanabe et al. ..... 307/296.1
5,223,751 6/1993 Simmons et al. ..... 307/475
5,394,028 2/1995 Feddeler et al. ..... 327/546

OTHER PUBLICATIONS

IEEE Journal of Solid-State Circuits, Nov. 1991, vol. 26, No. 11, "A Circuit Technology for Sub-10-ns ECL 4-Mb BiCMOS Dram's", Kawahara et al.

1991 Symposium on VLSI Circuits, Digest of Technical Papers, "A Circuit Technology for Sub-10ns ECL 4Mb BiCMOS DRAMs", Kawahara et al, May 30-Jun. 1, 1991, pp. 131-132.

*Primary Examiner*—Margaret Rose Wambach
*Attorney, Agent, or Firm*—Nikaido Marmelstein Murray & Oram, LLP

[57] ABSTRACT

A semiconductor integrated circuit device includes a voltage drop circuit for generating a dropped voltage from a power supply voltage externally supplied to a power supply line, and a plurality of circuits respectively connected to the voltage drop circuit and driven by the dropped voltage. A switching unit, which is connected to at least one of the circuits, connects the power supply line to the above one of the circuits in synchronism with operation of the above one of the circuits. The above one of the circuits is driven by currents from both the voltage drop unit and the power supply line in synchronism with the operation thereof.

29 Claims, 10 Drawing Sheets

SEMICONDUCTOR INTEGRATED CIRCUIT DEVICE HAVING BUILT-IN VOLTAGE DROP CIRCUIT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention generally relates to semiconductor integrated circuit devices having built-in voltage drop circuits.

2. Description of the Prior Art

Recently, there has been considerable activity in the research and development of increasing storage capacity and integration density. Under the above conditions, fine patterns and fine transistors are used. However, fine transistors, such as transistors having short channel lengths, do not have good resistance to hot carriers. In order to improve resistance to hot carriers, it is proposed to mount a voltage drop circuit on a chip. The voltage drop circuit functions to drop a power supply voltage externally supplied and use a dropped power supply voltage in some circuits mounted on the chip or all circuits mounted thereon.

FIG. 1 shows a conventional dynamic random access memory (DRAM) with a built-in voltage drop circuit. The DRAM shown in FIG. 1 comprises an address buffer 1, a row decoder 2, a memory cell array 3, a sense amplifier block 4, a column decoder 5, a column gate block 6, an output circuit 7, an input circuit 8, a control circuit 9 and a voltage drop circuit 10. The control circuit 9 is supplied with a row address strobe signal /RAS ("/" means an active-low signal, and /RAS is equivalent to $\overline{RAS}$ shown in FIG. 1), a column address strobe signal /CAS, and a write enable signal /WE. Din denotes input data applied to the input circuit 8, and Dout denotes output data from the output circuit 7. VCC denotes an external high-potential power supply voltage equal to, for example 5 V, and VSS denotes an external low-potential power supply voltage equal to, for example, 0 V. VII denotes a dropped voltage generated by the voltage drop circuit 10.

Row address bits A0–An are applied to the row decoder 2 via the address buffer 1, and the row decoder 2 selects one of the word lines running in the cell array 3. In this case, cells connected to the selected word line are concurrently selected, and information pieces stored in the selected cells are output to bit lines. Sense amplifiers provided in the sense amplifier block 4 respectively amplify the information pieces.

Column address bits, which are input in a time sharing process, are applied to the column decoder 5 via the address buffer 1. The column decoder 5 generates a decoded address signal for selecting one of the bit lines running in the cell array 3. The information piece connected to the selected bit line is transferred from the sense amplifier block 4 to the output circuit 7 via the column gate block 6.

The above-mentioned write and read operation is carried out in synchronism with various control signals $\phi_1, \ldots, \phi_n$ generated by the control circuit 9 on the basis of the row address strobe signal /RAS, the column address strobe signal /CAS, and the write enable signal /WE. The voltage drop circuit 10, which is provided separately from the control circuit 9, receives the power supply voltage VCC supplied outside of the chip, and generates the dropped voltage VII (<VCC) therefrom.

FIG. 2 shows the voltage drop circuit 10 and a circuit to which the dropped voltage is applied. In FIG. 2, a sense amplifier driving circuit 11 is connected to the voltage drop circuit 10. A sense amplifier 12 is connected to a pair of bit lines BL0 and /BL0, and a sense amplifier 13 is connected to a pair of bit lines BL1 and /BL1. A memory cell 14 is connected to the bit line BL0 and a word line WL, and a memory cell 15 is connected to the bit line BL1 and the word line WL.

The voltage drop circuit 10 comprises a VCC power supply line 16, and an n-channel MOS (Metal Oxide Semiconductor) transistor (hereinafter simply referred to as an nMOS transistor) 17. The drain and gate of the nMOS transistor 17 are connected to the VCC power supply line 16. The dropped voltage VII, which is equal to VCC-Vth17 (where Vth17 is the threshold voltage of the nMOS transistor 17), is generated via the source of the nMOS transistor 17. A resistor 19 is a parasitic resistance of a wiring line 18 connecting the voltage drop circuit 10 and the sense amplifier driving circuit 11.

The sense amplifier driving circuit 11 comprises a wiring line 20 via which the dropped voltage VII is transferred, a clock input terminal 21, an inverter 22, a p-channel MOS transistor (hereinafter simply referred to as a pMOS transistor) 23, and an nMOS transistor 24. S1 denotes the output signal of the inverter 22. The clock input terminal 21 receives a sense amplifier driving circuit clock Φ for driving or enabling the sense amplifier driving circuit 11. When the clock Φ is maintained at a high (H) level, the circuit 11 turns ON the pMOS transistor 23 and the nMOS transistor 24. A sense amplifier driving voltage PSA obtained at the drain of the pMOS transistor 23 and a sense amplifier driving voltage NSA obtained at the drain of the nMOS transistor 24 drive the sense amplifiers 12 and 13.

The sense amplifier 12 includes a flip-flop made up of pMOS transistors 25 and 26, and nMOS transistors 27 and 28. The sense amplifier 13 is configured in the same manner as the sense amplifier 12. The memory cell 14 is a one-transistor-type cell, and is made up of an nMOS transistor 29 and a capacitor 30. PC denotes a cell plate voltage.

FIG. 3 is a waveform diagram showing the operation of the circuit shown in FIG. 2. The waveform diagram shown in FIG. 3 relates to the bit lines BL0 and /BL0. It will be noted that the same operation as shown in FIG. 3 will take place in other bit lines.

The word line WL is selected, and the voltage thereof increases from a low (L) level to the high level. Then, the nMOS transistor 29 is turned ON, and the bit line BL0 is connected to an internal node 31 of the cell 14. Hence, a signal quantity dependent on the ratio of the capacitance of the capacitor 30 and the parasitic capacitance of the bit line BL0 appears at the bit line BL0. Assuming that the internal node 31 of the cell 14 is at the low level, the bit line BL0 decreases by the signal quantity (approximately a few hundred mV higher than/lower than a bit line reset level, which is equal to approximately half the VCC.

Thereafter, the sense amplifier driving circuit clock Φ switches from the low level to the high level. In response to this change, the output signal S1 of the inverter 22 is switched from the high level to the low level, and the pMOS transistor 23 and the nMOS transistor 24 are turned ON. As a result, the sense amplifier driving voltage PSA increases to the dropped voltage VII, and the sense amplifier driving voltage NSA decreases to the VSS. In the example being considered, the internal node 31 of the cell is at the low level, and hence the potential of the bit line BL0 is lower than the potential of the bit line /BL0 by the signal quantity. Hence, the pMOS transistor 26 and the nMOS transistor 27 are turned ON, and the pMOS transistor 25 and the nMOS transistor 28 are turned OFF. Hence, the potential of the bit line BL0 decreases to the VSS, and the potential of the bit line /BL0 increases to the dropped voltage VII. In this manner, the sense amplifier 12 senses data stored in the capacitor 30.

During the sense operation of the sense amplifier 12, a current passes through the wiring line 18, the pMOS transistor 23, the pMOS transistor 26 and the bit line /BL0 in that order. The above current is large because of the characteristic of the sense amplifier 12. Hence, a large voltage drop is developed across the parasitic resistance 19 of the wiring line 18, and other circuits to which the dropped voltage VII is applied may not operate normally. The above problem is encountered in other semiconductor integrated circuit devices with built-in voltage drop circuits.

SUMMARY OF THE INVENTION

It is a general object of the present invention to provide a semiconductor integrated circuit device with a built-in voltage drop circuit, in which the above disadvantage is eliminated.

A more specific object of the present invention is to provide a semiconductor integrated circuit device in which the voltage drop developed across the parasitic resistance of the wiring line for the dropped voltage can be reduced and a plurality of circuits driven by the dropped voltage can operate normally.

The above objects of the present invention are achieved by a semiconductor integrated circuit device comprising: voltage drop means for generating a dropped voltage from a power supply voltage externally supplied to a power supply line; a plurality of circuits respectively connected to the voltage drop means and driven by the dropped voltage; and switching means, connected to at least one of the circuits, for connecting the power supply line to at least one of the circuits in synchronism with the operation of at least one of the circuits, at least one of the circuits being driven by currents from both the voltage drop means and the power supply line in synchronism with the operation thereof.

The above objects of the present invention are also achieved by a semiconductor integrated circuit device comprising: voltage drop means for generating a dropped voltage from a power supply voltage externally supplied to a power supply line; a plurality of circuits respectively connected to the voltage drop means and driven by the dropped voltage; and switching means, connected to at least one of the circuits, for connecting the power supply line to at least one of the circuits in synchronism with operation of at least one of the circuits so that a first current from the power supply line increases as a second current passing through at least one of the circuits increases, at least one of the circuits being driven by currents from both the voltage drop means and the power supply line in synchronism with the operation thereof.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
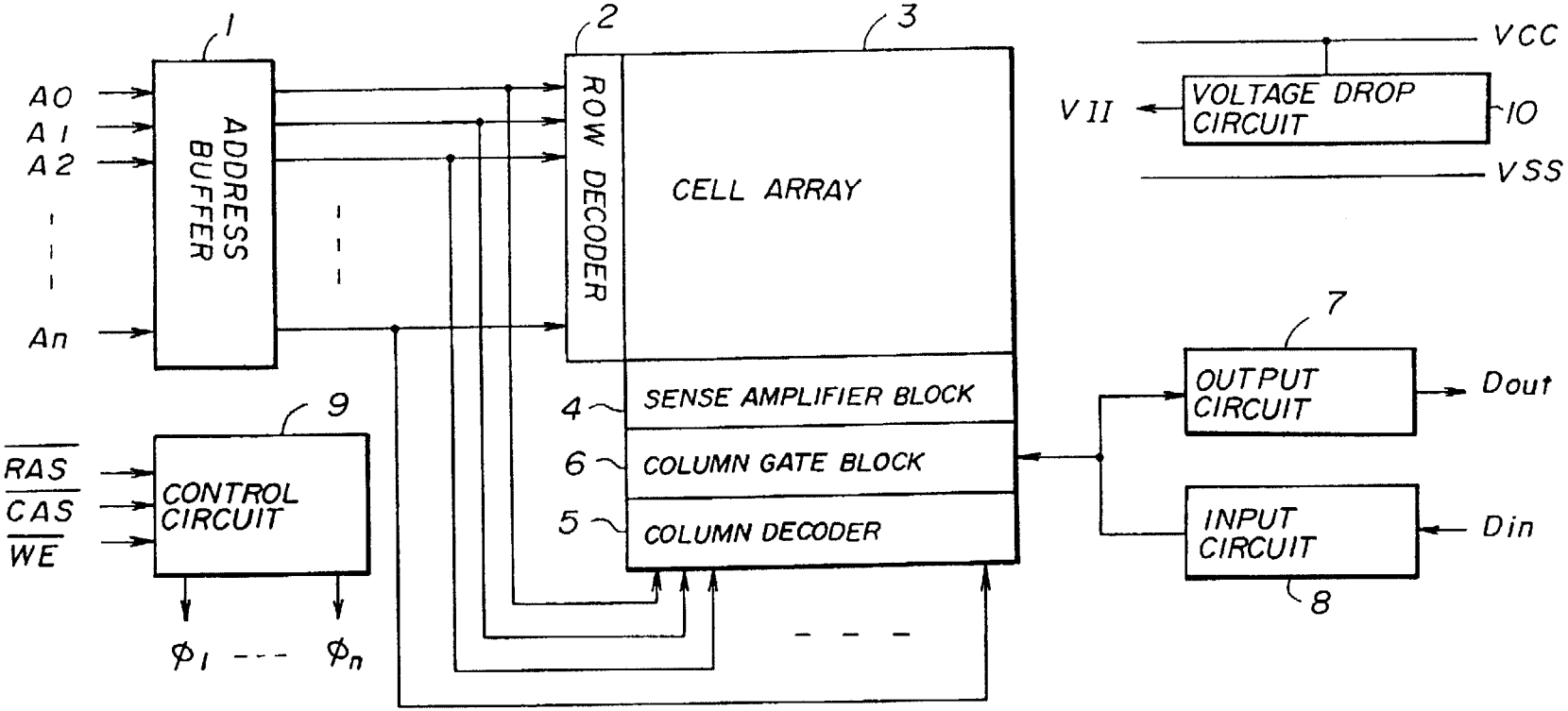
FIG. 1 PRIOR ART
FIG. 1 is a block diagram of a conventional DRAM with a built-in voltage drop circuit.
Figure 2:
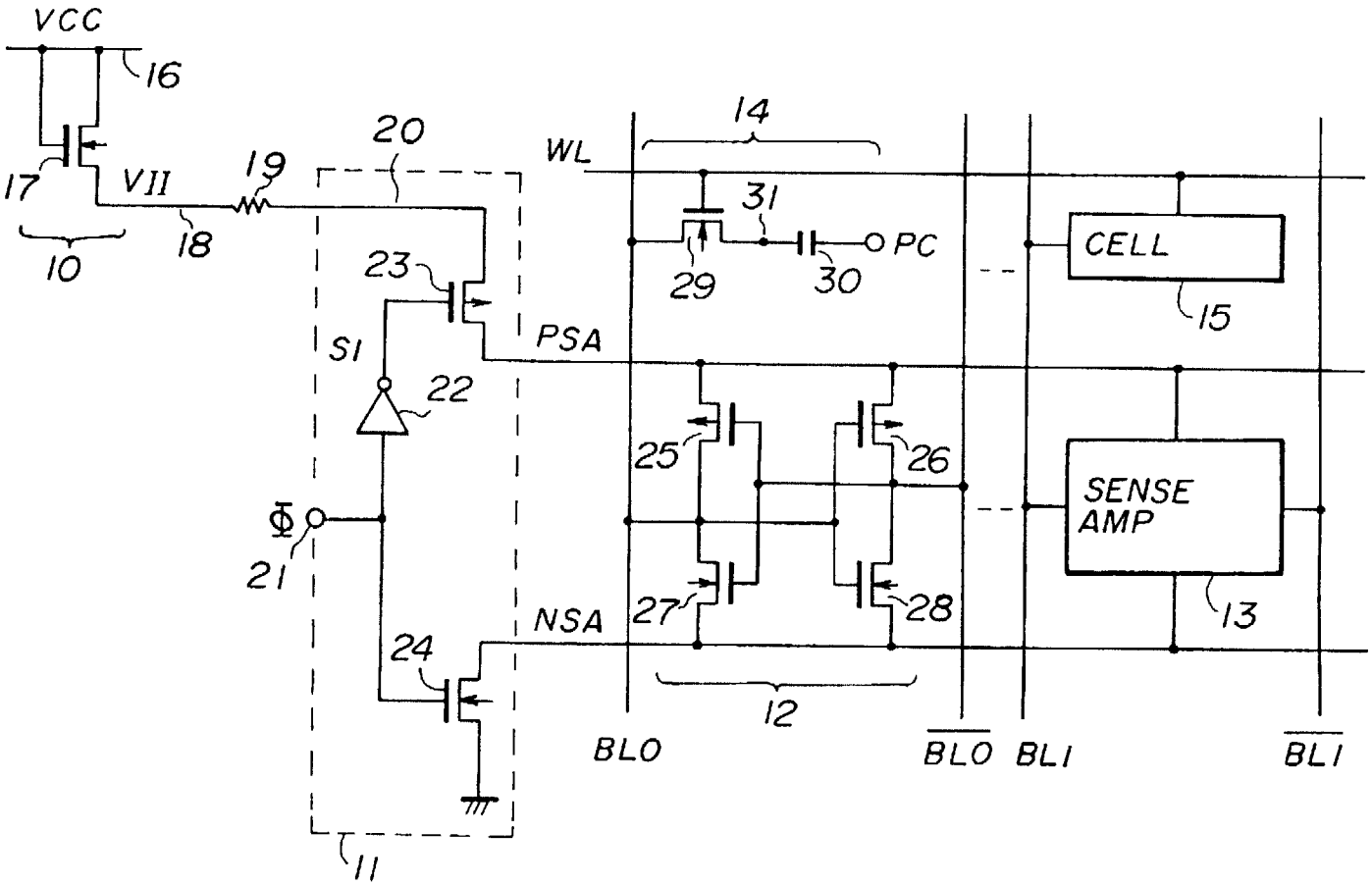
FIG. 2 PRIOR ART
FIG. 2 is a circuit diagram of a sense amplifier driving circuit shown in FIG. 1 and a circuit driven thereby.
Figure 3:
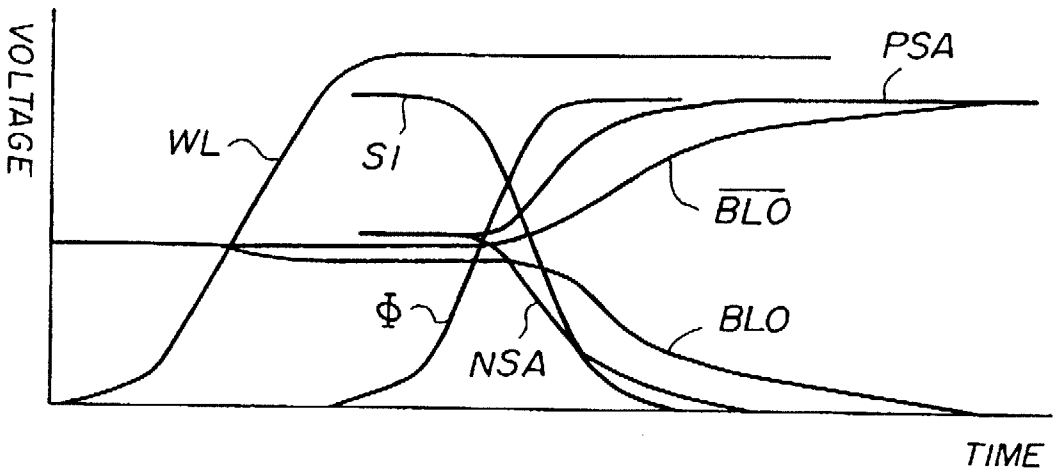
FIG. 3 PRIOR ART
FIG. 3 is a waveform diagram showing the operation of the circuit shown in FIG. 2.
Figure 4:
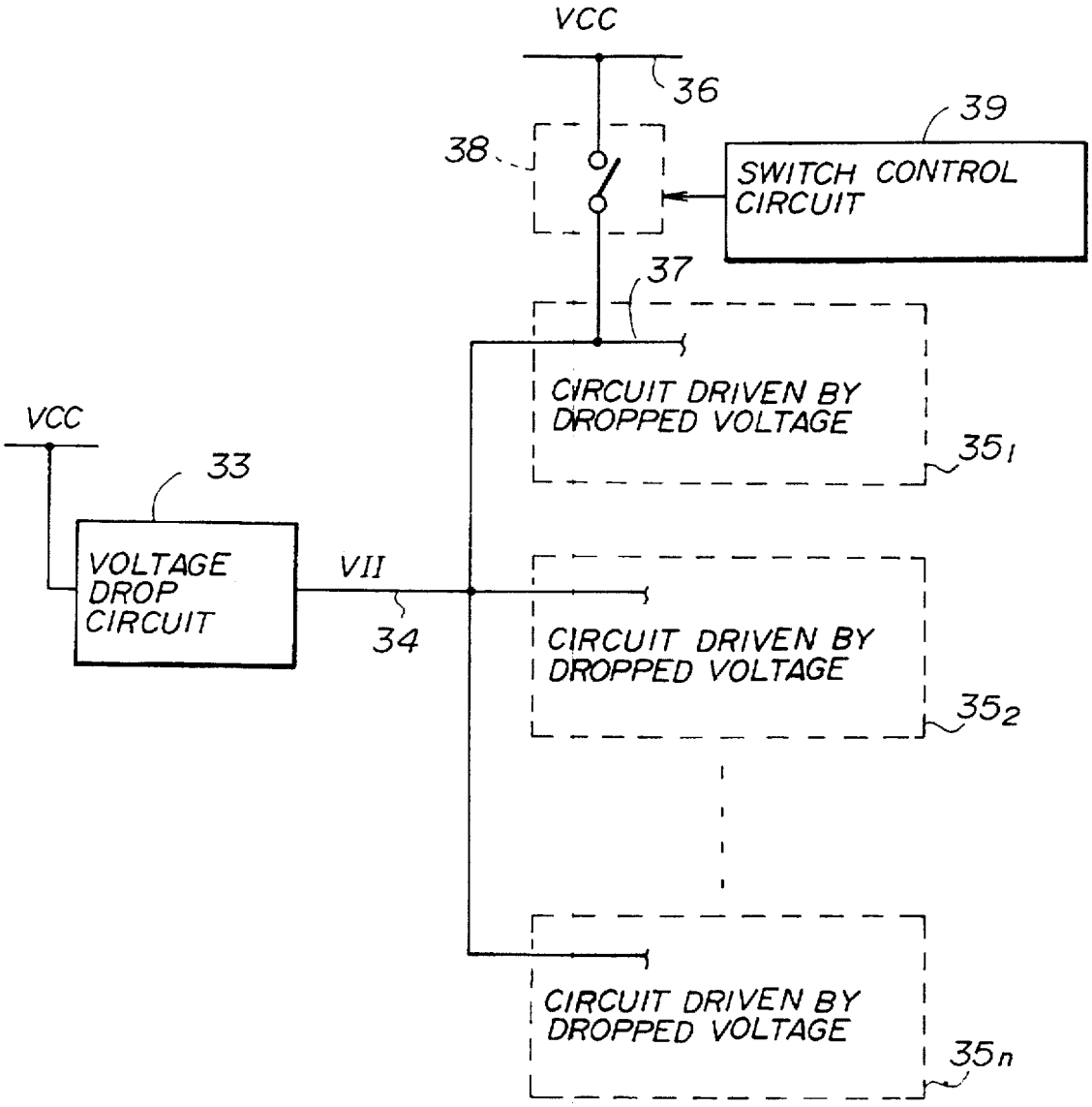
FIG. 4 is a block diagram showing an overview of the present invention.

Referring to FIG. 4, a semiconductor integrated circuit device comprises a built-in voltage drop circuit 33, a switch circuit 38, a switch control circuit 39, and circuits $35_1$–$35_n$ respectively driven by a dropped voltage VII generated by the voltage drop circuit 33 from the power supply voltage VCC. A wiring line 34 connects the voltage drop circuit 33 to the driven circuits $35_1$–$35_n$. The switch circuit 38 is provided between a VCC line 36 and a wiring line 37 running in at least one of the driven circuits $35_1$–$35_n$. The wiring line 34 is connected to wiring lines 37 respectively provided in the driven circuits $35_1$–$35_n$. The switch control circuit 39 controls switching of the switch circuit 38. More specifically, the switch control circuit 39 turns ON the switch circuit 38 in synchronism with the operation of the driven circuit $35_1$ having the wiring line 37 connected to the switch 36.

When the driven circuit $35_1$ is operated, the switch control circuit 39 turns ON the switch circuit 38. Hence, not only a current from the voltage drop circuit 33 but also a current from the power supply wiring line 36 passes through the driven circuit $35_1$. With the above circuit configuration, it becomes possible to reduce the voltage drop because of the parasitic resistance of the wiring line 34. Hence, even if a large current passes through the driven circuit $35_1$ while the other driven circuits $35_2$–$35_n$ are operating, they can operate normally.

A description will now be given of a first embodiment of the present invention.

Figure 5:
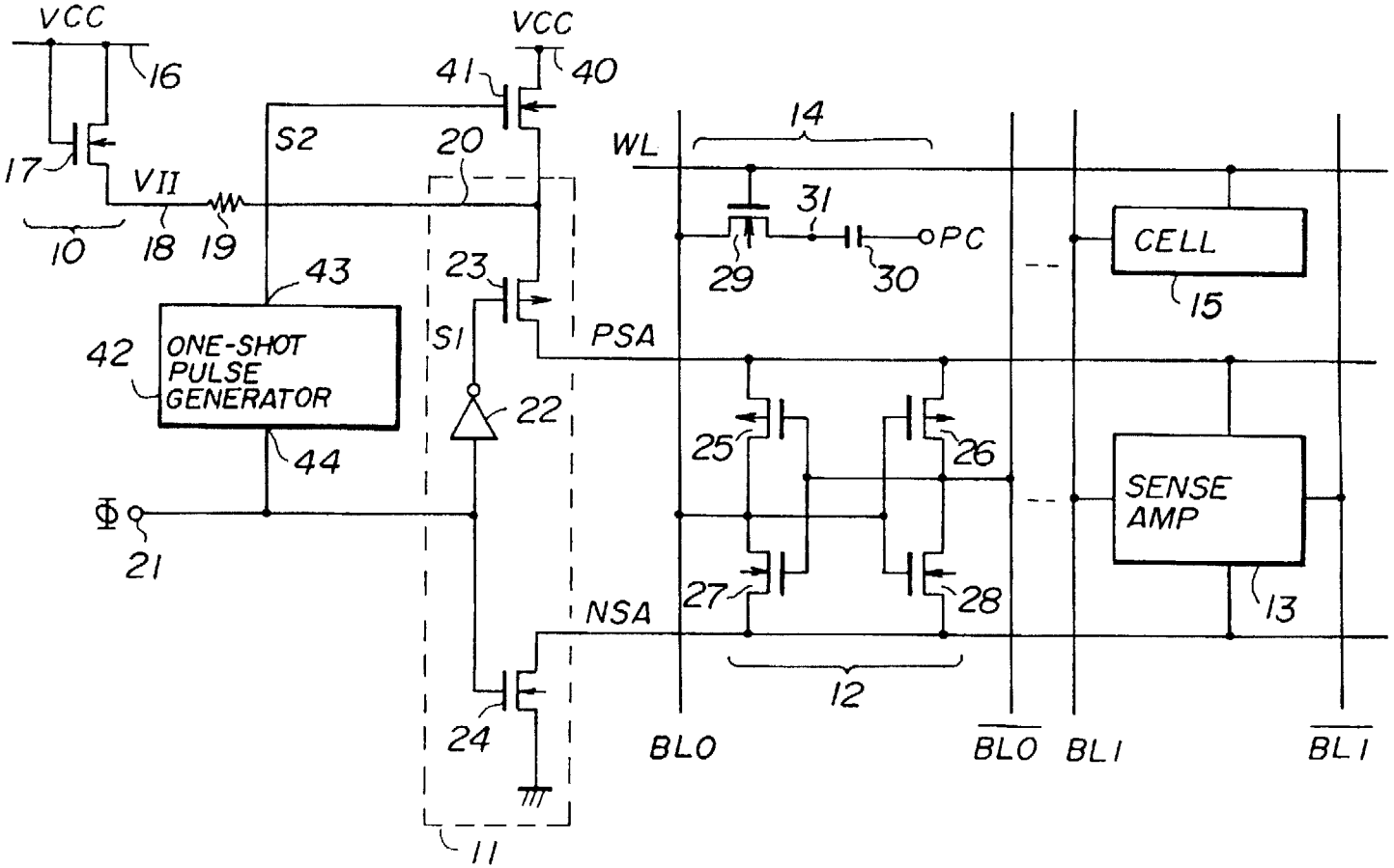
FIG. 5 is a circuit diagram of a first embodiment of the present invention.

FIG. 5 is a circuit diagram of an essential part of the first embodiment. In FIG. 5, parts that are the same as parts shown in the previously described figures are given the same reference numbers as previously. The circuit configuration shown in FIG. 5 comprises a VCC line 40 for transferring the external power supply voltage VCC to circuits, an nMOS transistor 41 corresponding to the switch circuit 38, and a one-shot pulse generator 42 corresponding to the switch control circuit 39. S2 denotes a one-shot pulse output via a one-shot pulse output terminal 43 of the one-shot pulse generator 42.

The drain of the nMOS transistor 41 is connected to the VCC power supply line 40, and the source thereof is connected to a wiring line 20 provided in the sense amplifier driving circuit 11 and used for transferring the dropped voltage VII from the voltage drop circuit 33 to the circuit 11. The gate of the nMOS transistor 41 is connected to the one-shot pulse output terminal 42 of the one-shot pulse generator 42.

Figure 6:
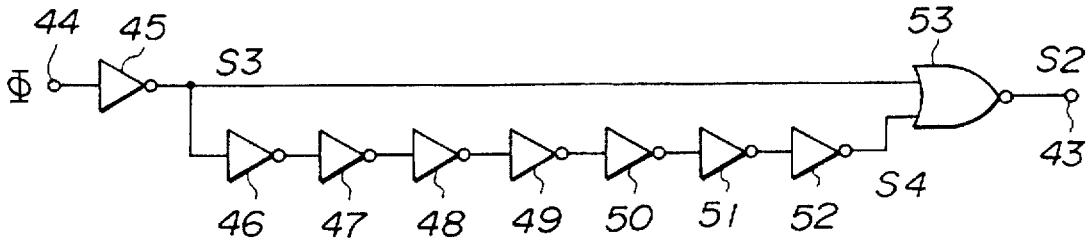
FIG. 6 is a circuit diagram of a one-shot pulse generator shown in FIG. 5.

FIG. 6 is a block diagram of the one-shot pulse generator 42, which comprises a clock input terminal 44 connected to the sense amplifier driving circuit 11, inverters 45–52, and a NOR circuit 53 in addition to the above-mentioned one-shot pulse output terminal 43. The sense amplifier driving circuit clock Φ is applied to the terminal 44. The inverters 46–52 are cascaded. The output terminal of the inverter 45 is connected to one terminal of the NOR circuit 53 and the input terminal of the inverter 46. The output terminal of the inverter 52 is connected to the other input terminal of the NOR circuit 53.

Figure 7:
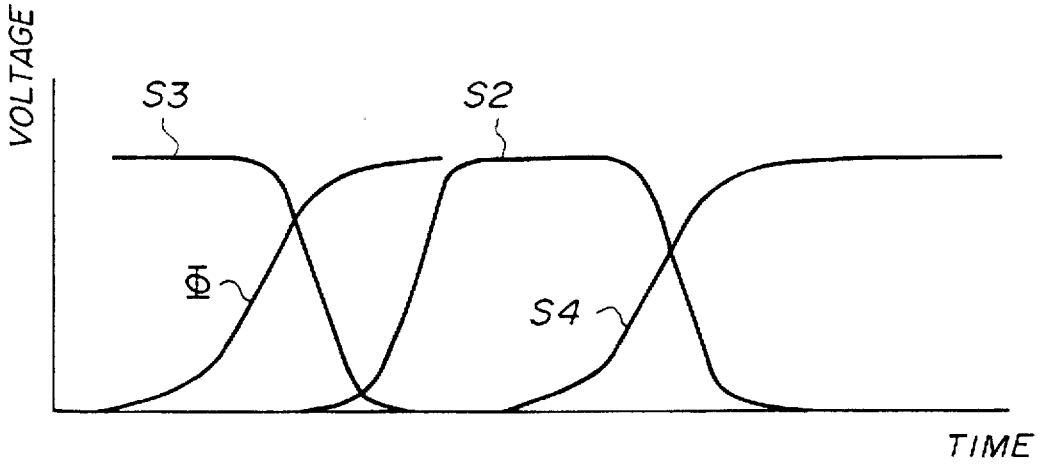
FIG. 7 is a waveform diagram showing the one-shot pulse generator shown in FIG. 6.

FIG. 7 is a waveform diagram showing the operation of the one-shot pulse generator 42. In a case where the sense amplifier driving circuit 11 is not driven and the clock Φ is maintained at the low 10 level, the output signal S3 of the inverter 45 is maintained at the high level, and the output signal S4 of the inverter 52 is maintained at the low level. Hence, the output signal of the NOR circuit 53 is maintained at the low level.

Thereafter, the clock Φ is switched from the low level to the high level in order to drive the sense amplifier driving circuit 11. At this time, the output signal S4 of the inverter 52 does not switch to the high level because of a delay time caused by the cascaded inverters 46–52. That is, the output signal S4 of the inverter 52 is maintained at the low level. Hence, the output signal of the NOR circuit 53 is switched to the high level.

When the delay time of the inverters 46–52 has elapsed, the output signal S4 of the inverter 52 is switched to the high level. At this time, the output signal S3 of the inverter 45 is at the low level, and hence the output signal of the NOR circuit 53 is switched to the low level. In this manner, a one-shot pulse S2 is generated when the currents pass through the sense amplifiers 12 and 13.

According to the first embodiment of the present invention, the AMOS transistor 41 is turned ON in response to the positive one-shot pulse S2 generated by the one-shot pulse generator 42 when the clock Φ is switched from the low level to the high level in order to drive the sense amplifier driving circuit 11 and the pMOS transistor 23 and the nMOS transistor 24 are turned ON so that currents pass through the sense amplifiers 12 and 13.

Hence, the sense amplifier driving circuit 11 is supplied with not only current from the voltage drop circuit 10 but also current from the VCC power supply line 40. Hence, it is possible to prevent an increase in the voltage drop developed across the parasitic resistance 19 of the wiring line 18 for the dropped voltage VII.

When the amount of the current passing through the pMOS transistor 23 of the sense amplifier driving circuit 11 is set equal to the amount of the current passing through the nMOS transistor 41, no voltage drop can be developed in the wiring line 18 even when the circuit 11 operates.

A description will now be given of a second embodiment of the present invention with reference to FIG. 8, in which parts that are the same as parts shown in the previously described figures are given the same reference numbers as previously.

Figure 8:
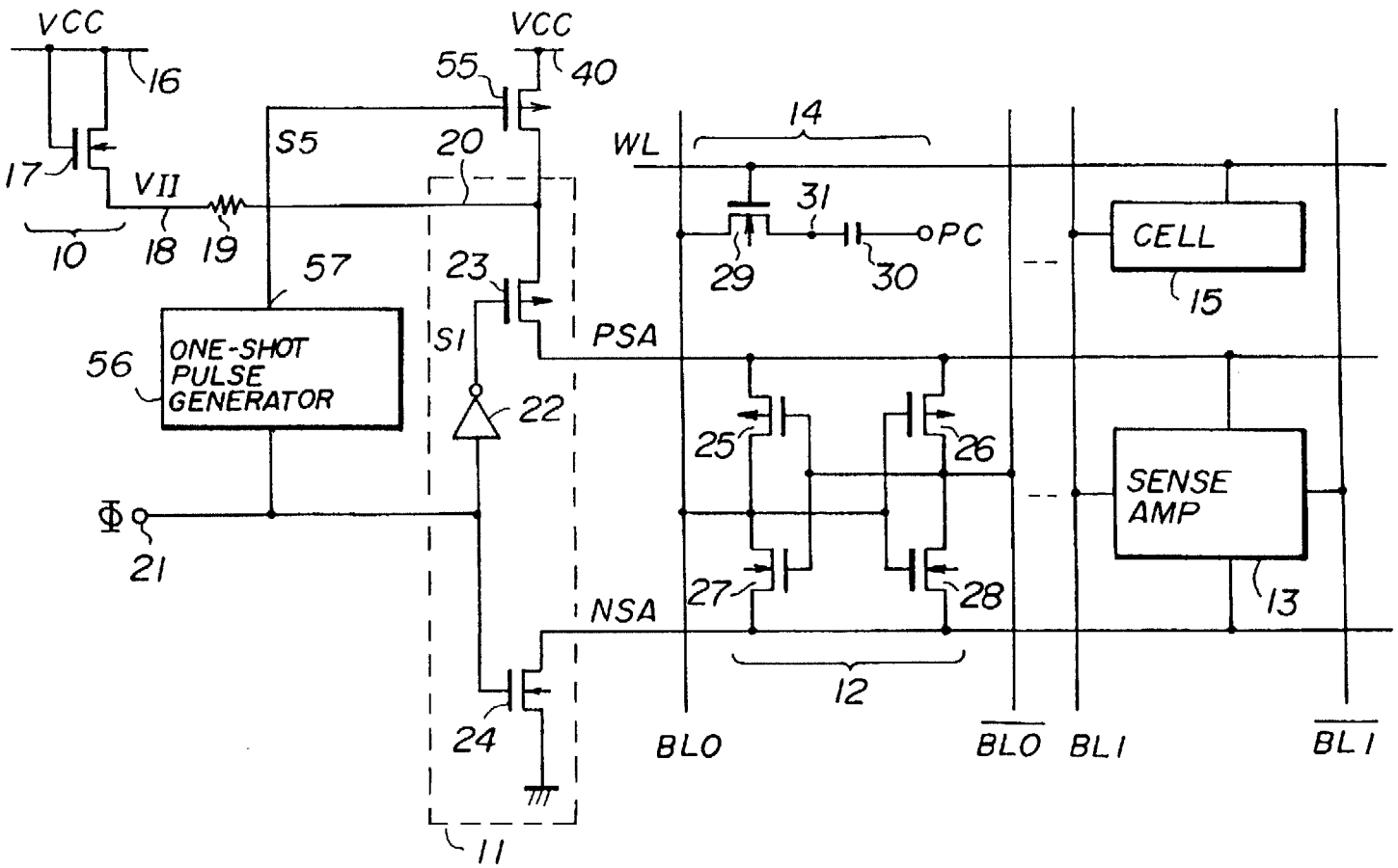
FIG. 8 is a circuit diagram of a second embodiment of the present invention.

The circuit configuration shown in FIG. 8 comprises a VCC line 54 for transferring the external power supply voltage VCC to circuits, a pMOS transistor 55 corresponding to the switch circuit 38, and a one-shot pulse generator 56 corresponding to the switch control circuit 39. S5 denotes a one-shot pulse output via a one-shot pulse output terminal 57 of the one-shot pulse generator 56. The source of the pMOS transistor 55 is connected to the VCC line 54, and the drain thereof is connected to the wiring line 20 in the sense amplifier driving circuit 11. The gate of the pMOS transistor 55 is connected to the one-shot pulse output terminal 57 of the one-shot pulse generator 56.

Figure 9:
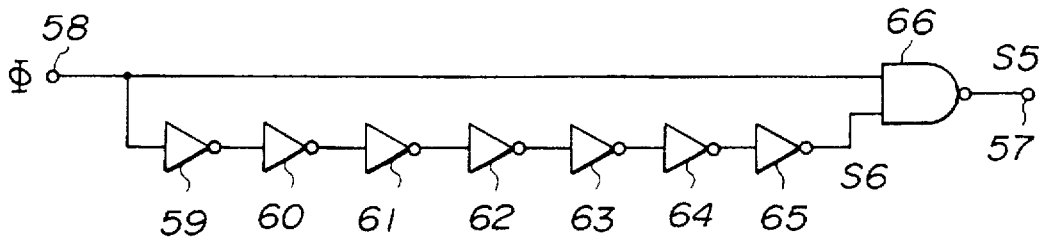
FIG. 9 is a circuit diagram of a one-shot pulse generator shown in FIG. 8.

FIG. 9 is a block diagram of the one-shot pulse generator 56, which comprises a clock input terminal 58 connected to the sense amplifier driving circuit 11, inverters 59–65, and a NAND circuit 66 in addition to the above-mentioned one-shot pulse output terminal 57. The sense amplifier driving circuit clock Φ is applied to the terminal 58. The inverters 59–65 are cascaded. The clock input terminal 58 is connected to one terminal of the NAND circuit 66 and the input terminal of the inverter 46. The output terminal of the inverter 65 is connected to the other input terminal of the NAND circuit 66.

Figure 10:
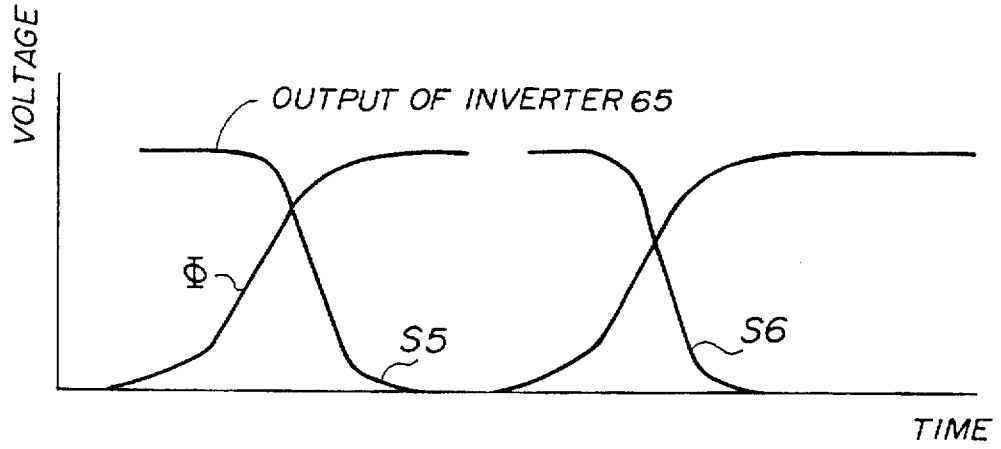
FIG. 10 is a waveform diagram of the one-shot pulse generator shown in FIG. 9.

FIG. 10 is a waveform diagram showing the operation of the one-shot pulse generator 56 shown in FIG. 9. In the case where the sense amplifier driving circuit 11 is not driven and the clock Φ for driving the sense amplifier driving circuit 11 is maintained at the low level, the output signal S6 of the inverter 65 is maintained at the high level, and hence the output signal of the NAND circuit 66 is maintained at the high level.

Thereafter, the clock Φ for driving the sense amplifier driving circuit 11 is switched from the low level to the high level in order to drive the driving circuit 11. At this time, the clock Φ is maintained at the high level, and hence the output signal of the NAND circuit 66 is switched to the low level. In this manner, a one-shot pulse S5 is generated.

According to the second embodiment of the present invention, the pMOS transistor 55 is turned ON in response to the negative one-shot pulse S5 generated by the one-shot pulse generator 56 when the clock Φ is switched from the low level to the high level in order to drive the sense amplifier driving circuit 11 and the pMOS transistor 23 and the nMOS transistor 24 are turned ON so that currents pass through the sense amplifiers 12 and 13.

Hence, the sense amplifier driving circuit 11 is supplied with not only current from the voltage drop circuit 10 but also current from the VCC power supply line 40. Hence, it is possible to prevent an increase in the voltage drop developed across the parasitic resistance 19 of the wiring line 18 for the dropped voltage VII.

When the amount of the current passing through the pMOS transistor 23 of the sense amplifier driving circuit 11 is set equal to the amount of the current passing through the pMOS transistor 55, no voltage drop can be developed in the wiring line 18 even when the circuit 11 operates.

A description will now be given of a third embodiment of the present invention with reference to FIG. 11, in which parts that are the same as parts shown in the previously described figures are given the same reference numbers.

Figure 11:
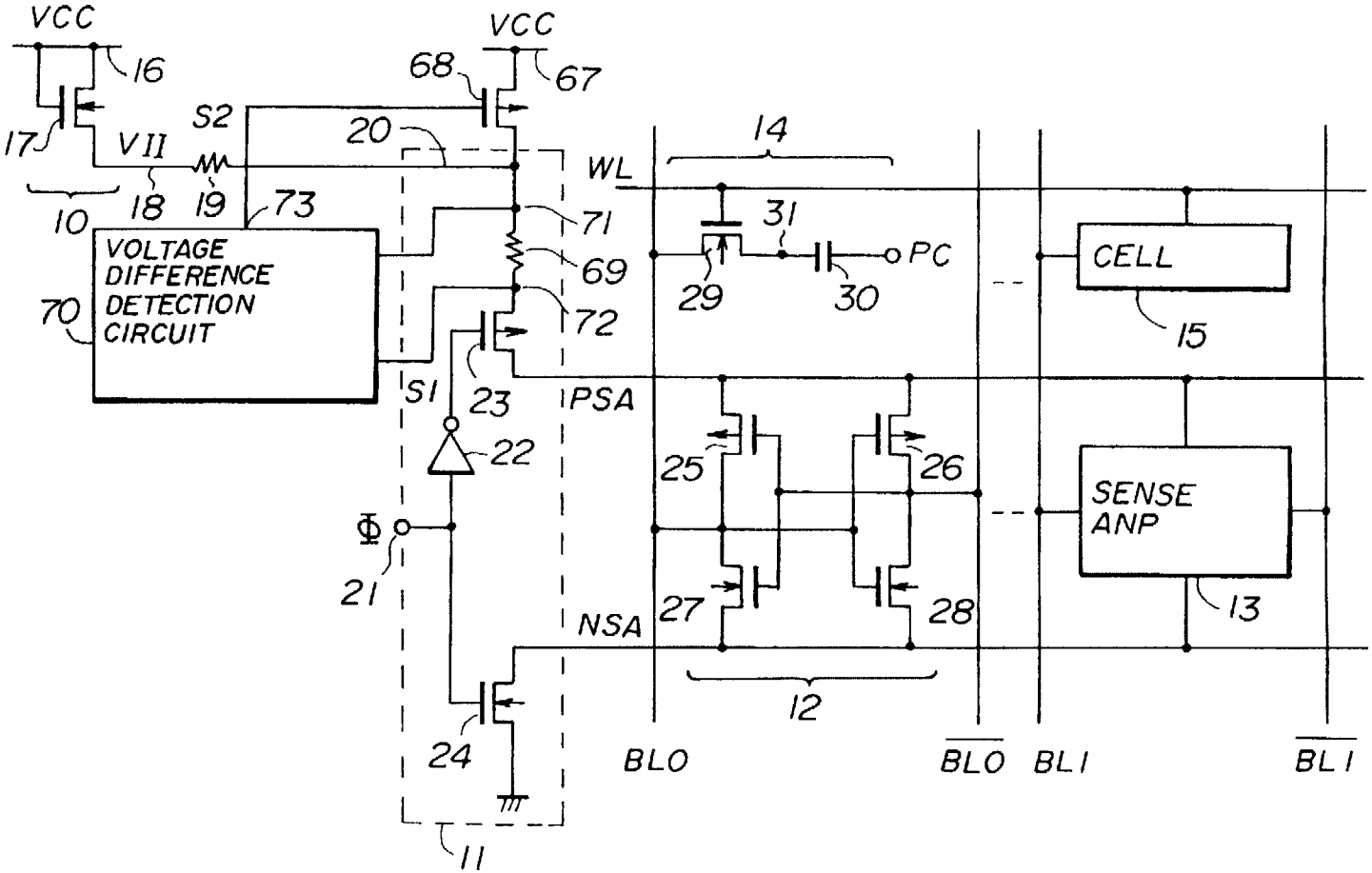
FIG. 11 is a circuit diagram of a third embodiment of the present invention.

The circuit shown in FIG. 11 comprises a pMOS transistor 68 corresponding to the switch circuit 38 shown in FIG. 4, a resistor 69, a voltage difference detection circuit 70, which detects the difference between the voltage at one end of the resistor 69 and the voltage at the other end thereof. The circuit 70 corresponds to the switch control circuit 39 shown in FIG. 4.

The wiping line 20 in the sense amplifier driving circuit 11 is connected to the source of the pMOS transistor 23 via the resistor 69. The drain of the pMOS transistor 68 is connected to the VCC power supply line 67, and the source thereof is connected to one end of the resistor 69. The gate of the pMOS transistor 68 is connected to the output terminal 73 of the difference voltage detection circuit 70.

Figure 12:
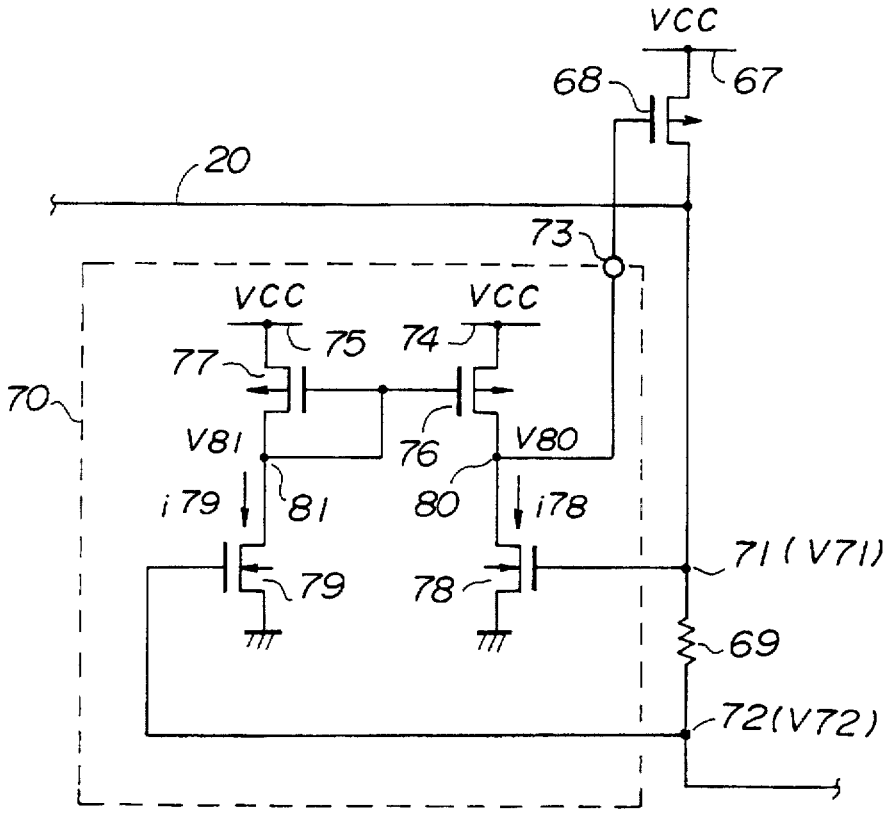
FIG. 12 is a circuit diagram of a voltage difference detection circuit shown in FIG. 10.

FIG. 12 is a circuit diagram of the voltage difference detection circuit 70, which comprises VCC power supply lines 74 and 75, pMOS transistors 76 and 77, and nMOS transistors 78 and 79.

The source of the pMOS transistor 76 is connected to the VCC line 74, and the gate thereof is connected to the gate and the drain of the pMOS transistor 77. The drain of the pMOS transistor 76 is connected to the output terminal 73 and the drain of the nMOS transistor 78. The source of the pMOS transistor 77 is connected to the VCC line 75, and the drain thereof is connected to the drain of the nMOS transistor 79. The gate of the nMOS transistor 78 is connected to one end 71 of the resistor 69, and the source thereof is grounded. The gate of the nMOS transistor 79 is connected to the other end 72 of the resistor 69, and the source thereof is grounded.

When there is no voltage drop developed across the resistor 69, that is, when a voltage V71 at the terminal 71 of the resistor 69 is equal to a voltage V72 at the terminal 72 of the resistor 69, the circuit parameters are selected so that the pMOS transistor 68 is OFF. When the sense amplifier driving circuit 11 is not driven, no current passes through the pMOS transistor 68.

According to the third embodiment of the present invention, the clock Φ is switched from the low level to the high level in order to drive the sense amplifier driving circuit 11, the pMOS transistor 23 and the nMOS transistor 24 are turned ON, and currents pass through the sense amplifiers 12 and 13. Hence, the voltage V71 is greater than the voltage V72. As a result, current i78 passing through the AMOS transistor 78 becomes greater than current i79 passing through the nMOS transistor 79, and a voltage V80 at a node 80 decreases and becomes less than a voltage V81 at a node 81. The amount of decrease in the voltage V80 increases as the voltage drop developed across the resistor 69, that is, the difference between the voltages V71 and V72 increases. In other words, as the current passing through the resistor 69 increases, the nMOS transistor 78 is turned more strongly ON. Hence, the voltage V80 decreases, and the pMOS transistor 68 is turned more strongly ON. Hence, the current supplied from the VCC line 67 increases.

According to the third embodiment, the pMOS transistor 68 is turned ON by the voltage V80 of the node 80 output via the output terminal 73 of the voltage difference detection circuit 70 when the clock Φ is switched from the low level to the high level in order to drive the sense amplifier driving circuit 11, and the pMOS transistor 23 and the nMOS transistor 24 are turned ON so that currents pass through the sense amplifiers 12 and 13.

Hence, the sense amplifier driving circuit 11 is supplied from current from the voltage drop circuit 10 but also current from the VCC power supply line 67. Hence, it is possible to prevent an increase in the voltage drop developed across the parasitic resistance 19 of the wiring line 18 for the dropped voltage VII.

In addition, according to the third embodiment, the current supplied from the VCC power supply line 67 to the sense amplifier driving circuit 11 increases as the current passing through the circuit 11 increases. Hence, variations in the voltage drop across the parasitic resistance 19 of the wiring line 18 can be suppressed.

The present invention is not limited to the specifically disclosed embodiments, and variations and modifications may be made without departing from the scope of the present invention. For example, the present invention includes not only DRAMs but also flash memories, SRAMs and EEPROMs.

What is claimed is:

1. A semiconductor integrated circuit device comprising:

voltage drop means for generating a dropped voltage from a power supply voltage externally supplied to a power supply line;

a plurality of circuits respectively connected to the voltage drop means and driven by the dropped voltage; and switching means, connected to at least one of the circuits, for connecting the power supply line to said at least one of the circuits in synchronism with operation of said at least one of the circuits, such that currents are simultaneously supplied to the circuits from the voltage drop means and the power supply line, in order to prevent a reduction in the dropped voltage.

2. The semiconductor integrated circuit device as claimed in claim 1, wherein said switching means comprises:

a switch provided between the power supply line and said at least one of the circuits; and switch control means, connected to said at least one of the circuits, for receiving a driving signal for driving said at least one of the circuits and for controlling the switch to connect the power supply line and said at least one of the circuits when the driving signal is received.

3. The semiconductor integrated circuit device as claimed in claim 2, wherein a current passing through the switch has a magnitude equal to that of a current passing through said at least one of the circuits.

4. The semiconductor integrated circuit device as claimed in claim 2, wherein:

the switch comprises an n-channel MOS transistor connected between the power supply line and said at least one of the circuits; and said switch control means comprises a one-shot pulse generator for generating a one-shot pulse in response to the driving signal and for applying the one-shot pulse to a gate of the n-channel MOS transistor.

5. The semiconductor integrated circuit device as claimed in claim 4, wherein said one-shot pulse generator comprises delay means for delaying the driving signal by a predetermined delay time so that the one-shot pulse is generated after the predetermined delay time.

6. The semiconductor integrated circuit device as claimed in claim 2, wherein:

the switch comprises a p-channel MOS transistor connected between the power supply line and said at least one of the circuits; and said switch control means comprises a one-shot pulse generator for generating a one-shot pulse in response to the driving signal and for applying the one-shot pulse to a gate of the p-channel MOS transistor.

7. The semiconductor integrated circuit device as claimed in claim 6, wherein said one-shot pulse generator comprises delay means for delaying the driving signal by a predetermined delay time so that the one-shot pulse is generated after the predetermined delay time.

8. The semiconductor integrated circuit device as claimed in claim 1, wherein:

the circuits respectively comprise memory cells and sense amplifiers; and the semiconductor integrated circuit device is a dynamic random access memory device.

9. The semiconductor integrated circuit device as claimed in claim 1, wherein:

the circuits respectively comprise memory cells and sense amplifiers; and the semiconductor integrated circuit device is a flash memory device.

10. A semiconductor integrated circuit device comprising:

voltage drop means for generating a dropped voltage from a power supply voltage externally supplied to a power supply line;

a plurality of circuits respectively connected to the voltage drop means and driven by the dropped voltage; and switching means, connected to at least one of the circuits, for connecting the power supply line to said at least one of the circuits in synchronism with operation of said at least one of the circuits so that a first current from the power supply line increases as a second current passing through said at least one of the circuits increases, said at least one of the circuits being driven by currents from both the voltage drop means and the power supply line in synchronism with the operation thereof.

11. The semiconductor integrated circuit device as claimed in claim 10, wherein said switching means comprises:

a switch connected between the power supply line and said at least one of the circuits; and switch control means, connected to said at least one of the circuits, for receiving a driving signal for driving said at least one of the circuits and for controlling the switch to connect the power supply line and at least one of the circuits in response to the driving signal so that the first current from the power supply line increases as the second current passing through said at least one of the circuits increases.

12. The semiconductor integrated circuit device as claimed in claim 11, wherein:

said switch comprises current magnitude control means for controlling the magnitude of the first current in accordance with a control signal; and said switching control means comprises current detection means for detecting the magnitude of the second current passing through at least one of the circuits and for generating the control signal dependent on the magnitude of the second current.

13. The semiconductor integrated circuit device as claimed in claim 11, wherein:

said switch comprises a transistor connected between the power supply line and said at least one of the circuits; and said control signal is applied to a gate of the transistor so that the degree of ON state of the transistor is controlled in accordance with the control signal.

14. The semiconductor integrated circuit device as claimed in claim 11, wherein said switch control means comprises means for increasing the first current passing through the switch as the second current passing through said at least one of the circuits increases.

15. The semiconductor integrated circuit device as claimed in claim 13, wherein said transistor is a p-channel MOS transistor.

16. The semiconductor integrated circuit device as claimed in claim 10, wherein:

the circuits respectively comprise memory cells and sense amplifiers; and the semiconductor integrated circuit device is a dynamic random access memory device.

17. The semiconductor integrated circuit device as claimed in claim 10, wherein:

the circuits respectively comprise memory cells and sense amplifiers; and the semiconductor integrated circuit device is a flash memory device.

*18. A semiconductor device comprising:*

*a circuit receiving a power supply voltage and being selectively activated in response to a control signal;*

*a first power supply circuit for supplying a first voltage as the power supply voltage to said circuit; and*

*a second power supply circuit for temporarily supplying a second voltage as the power supply voltage to said circuit in response to the control signal when said circuit is activated wherein the magnitude of the second voltage is larger than the first voltage.*

*19. The semiconductor device as claimed in claim 18, wherein the circuit is activated during a predetermined period, and wherein said second power supply circuit supplies the second voltage during an initial period in the predetermined period.*

*20. The semiconductor device as claimed in claim 18, wherein said second power supply circuit comprises a pulse generator for generating a pulse in response to the control signal, and wherein the second voltage is supplied in response to the pulse.*

*21. A semiconductor device comprising:*

*a circuit receiving an operating current and being selectively activated;*

*a first power supply circuit for supplying a first current to said circuit; and*

*a second power supply circuit for temporarily supplying second current to said circuit when said circuit is activated whereby the operating current is temporarily increased.*

*22. A semiconductor memory device comprising:*

*a plurality of memory cells;*

*a plurality of bit lines operatively connected to said memory cells;*

*a plurality of sense amplifiers operatively connected to said bit lines respectively and selectively activated in response to a control signal;*

*a first power supply circuit operatively connected to said sense amplifiers for supplying a first power supply voltage as a power supply voltage of the sense amplifiers; and*

*a second power supply circuit operatively connected to said sense amplifiers for temporarily supplying a second voltage, which has a larger magnitude than the first voltage, as the power supply voltage in response to the control signal when the sense amplifiers are activated.*

*23. The semiconductor memory device as claimed in claim 22, wherein the second power supply circuit comprises a pulse generator for generating pulses in response to the control signal, a magnitude of the power supply voltage is increased in response to the pulses.*

*24. The semiconductor memory device as claimed in claim 22, wherein the sense amplifiers are activated during a predetermined period in response to the control signal, and wherein the second voltage is supplied during an initial period in the predetermined period.*

*25. The semiconductor memory device as claimed in claim 22, wherein the sense amplifiers are CMOS type amplifiers each having a first terminal and a second terminal receiving the power supply voltage therebetween.*

*26. The semiconductor memory device as claimed in claim 25, further comprising:*

*a first switch operatively connected to the first terminal;*

*a second switch operatively connected to the second terminal;*

*wherein the first and second switches are turned on in response to the control signal for supplying the power supply voltage therethrough to the CMOS type amplifier.*

*27. The semiconductor memory device as claimed in claim 22, further comprising:*

*a sense amplifier driving circuit connected between the first and second power supply circuits and the sense amplifiers, for activating the sense amplifiers in response to the control signal.*

*28. A semiconductor memory device, comprising:*

*a plurality of memory cells;*

*a plurality of bit lines operatively connected to said memory cells;*

*a plurality of sense amplifiers operatively connected to said bit lines, respectively, and selectively activated in response to a control signal;*

*a power supply line operatively connected to the sense amplifiers for supplying a power supply voltage;*

*a current detection circuit, connected to the power supply line, for generating a detection signal when a predetermined current is detected; and*

*a power supply circuit increasing the magnitude of the power supply voltage in response to the detection signal.*

*29. A semiconductor memory device comprising:*

*a plurality of memory cells;*

*a plurality of bit lines operatively connected to said memory cells;*

*a plurality of sense amplifiers operatively connected to said bit lines respectively and selectively activated in response to a control signal;*

*a power supply line operatively connected to the sense amplifiers for supplying an operating current;*

*a current detection circuit, connected to the power supply line, for generating a detection signal when a predetermined current is detected; and*

*a power supply circuit for supplying the operating current in response to the detection signal.*

* * * * *